(12) United States Patent
Gordon

(10) Patent No.: US 6,898,838 B2
(45) Date of Patent: May 31, 2005

(54) INFLATABLE BLADDER WITH SUCTION FOR SUPPORTING CIRCUIT BOARD ASSEMBLY PROCESSING

(75) Inventor: Brian F. Gordon, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/930,193

(22) Filed: Aug. 31, 2004

(65) Prior Publication Data

US 2005/0029724 A1 Feb. 10, 2005

Related U.S. Application Data

(62) Division of application No. 10/000,510, filed on Oct. 23, 2001.

(51) Int. Cl.⁷ ................................................. B23Q 7/00
(52) U.S. Cl. ........................... 29/559; 29/281.1; 269/21
(58) Field of Search ............................... 29/559, 281.1; 269/21, 20, 32, 269, 903, 266; 254/89 H, 93 HP; 92/90, 93, 94, 96

(56) References Cited

U.S. PATENT DOCUMENTS

| | | | |
|---|---|---|---|
| 5,092,510 A | 3/1992 | Anstrom et al. | 228/55 |
| 5,820,117 A * | 10/1998 | Thompson, Sr. et al. | 269/22 |
| 5,906,364 A * | 5/1999 | Thompson et al. | 269/22 |
| 6,189,876 B1 | 2/2001 | Frazier | 269/21 |
| 6,272,989 B1 | 8/2001 | Misono et al. | 101/474 |
| 6,318,433 B1 | 11/2001 | Reis et al. | 156/382 |
| 6,658,718 B2 | 12/2003 | Farnworth et al. | 29/559 |
| 2003/0074788 A1 * | 4/2003 | Gordon | 29/832 |

* cited by examiner

Primary Examiner—Lee D. Wilson
(74) Attorney, Agent, or Firm—Whyte Hirschboeck Dudek SC

(57) ABSTRACT

An inflatable bladder comprising at least one aperture and/or at least one baffle within the bladder for supporting a printed circuit board during component placement on a semiconductor substrate such as a printed circuit board is provided. The inflatable bladder is positioned to provide support for the substrate while apertures within the inflatable bladder communicate a suction force to the substrate to inhibit the substrate from bending, bowing, or flexing away from contact with the inflatable bladder during component placement. The inflatable bladder provides support for the substrate while attempting to prevent injury to components by pliably conforming to component irregularities on the back side of the substrate. The inflatable bladder can be selectively inflated or deflated for contacting the substrate and thereafter supporting the back side of the substrate during assembly operations. Alternatively, a lift table can be selectively raised or lowered for placing the inflatable bladder in contact with the back side of the substrate during assembly operations. The inflatable bladder can contain one or more baffles to define one or more compartments within the inflatable bladder. The inflatable bladder can be incorporated into a typical system for component assembly comprising a pair of rails, each having a slot therein, for receiving a substrate.

41 Claims, 7 Drawing Sheets

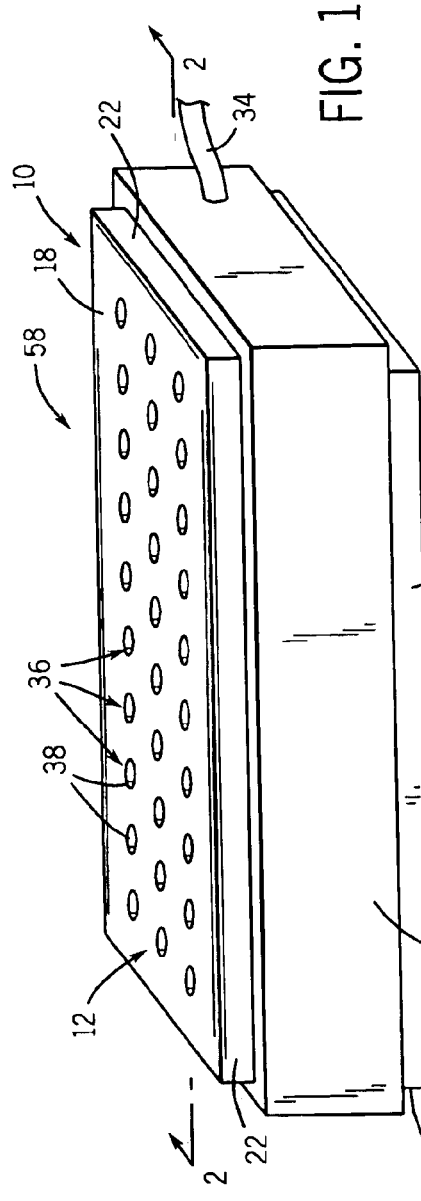
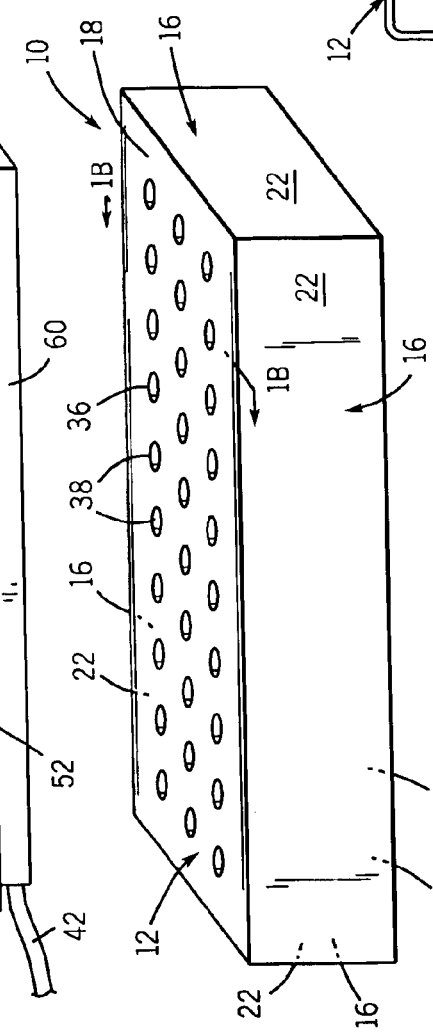
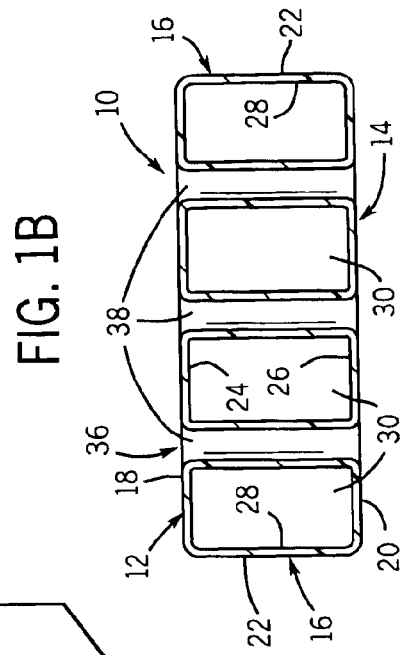
FIG. 1
FIG. 1A
FIG. 1B

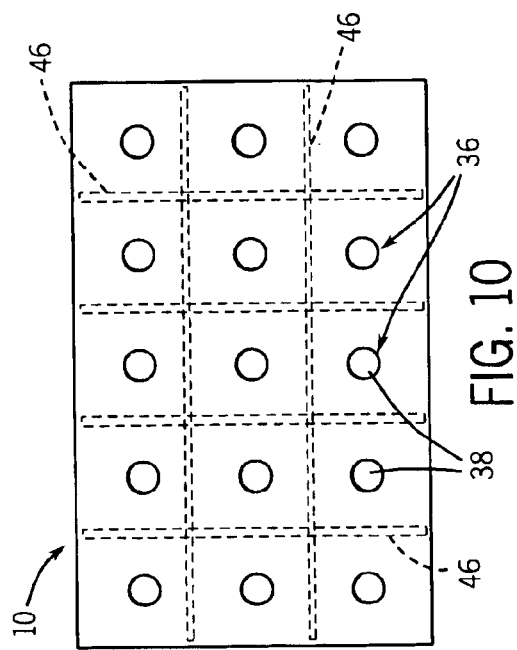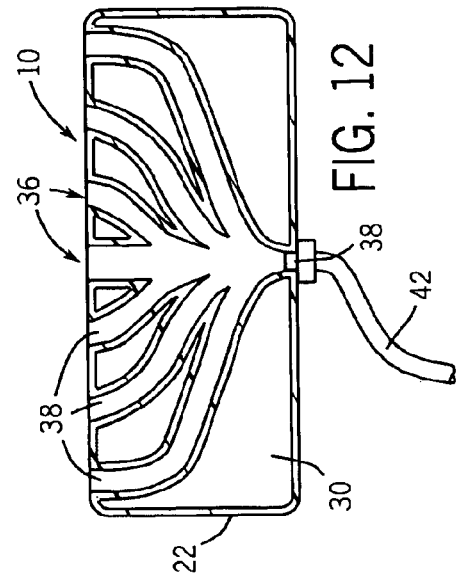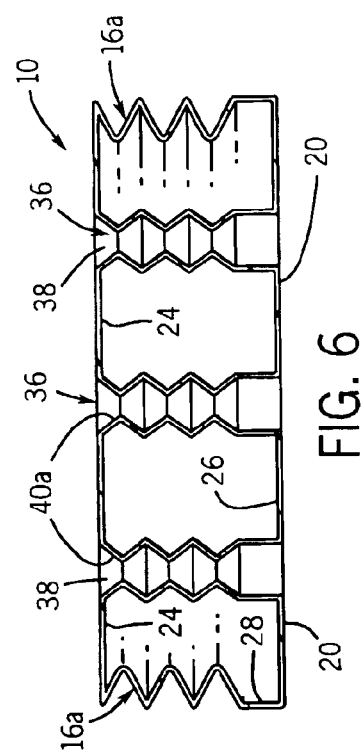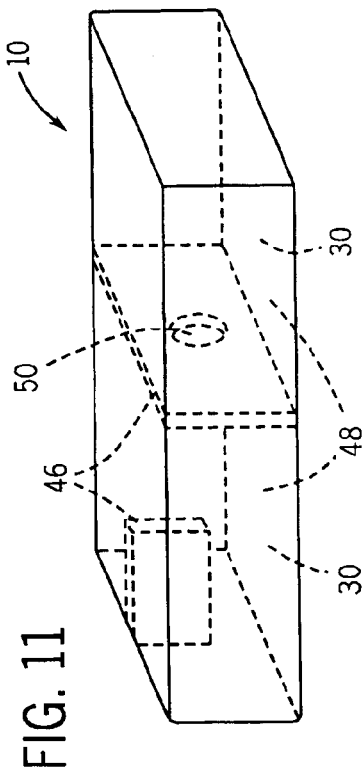

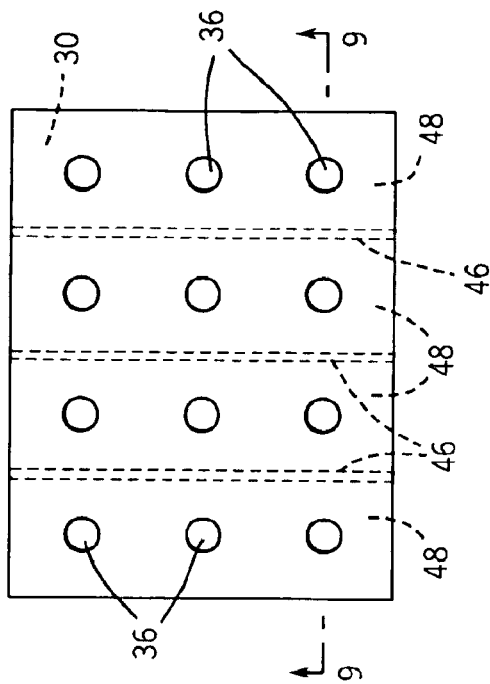
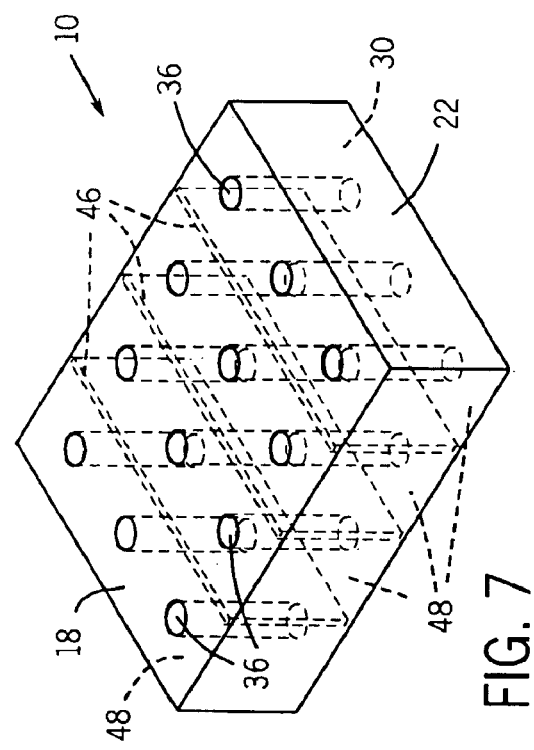
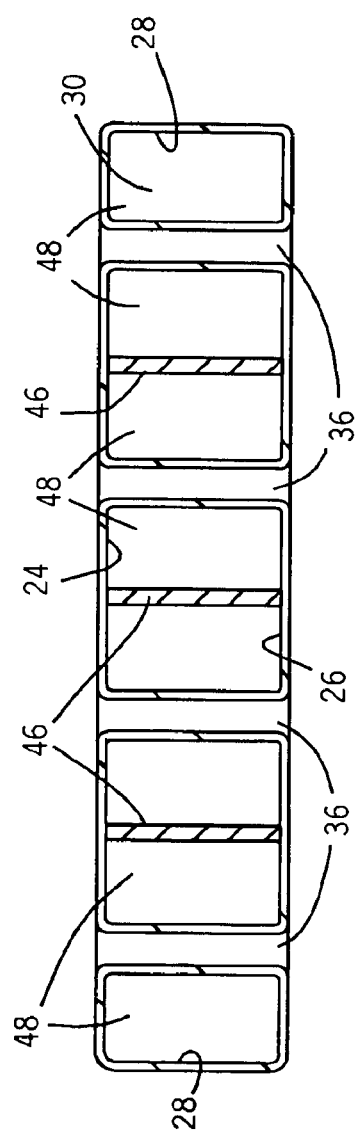

INFLATABLE BLADDER WITH SUCTION FOR SUPPORTING CIRCUIT BOARD ASSEMBLY PROCESSING

CROSS-REFERENCE TO RELATED APPLICATION

This application is a division of U.S. patent application Ser. No. 10/000,510, filed Oct. 23, 2001.

FIELD OF THE INVENTION

This invention relates in general to semiconductor device assembly processing and, more particularly, to an inflatable bladder for supporting and securing a semiconductor substrate during a component placement process.

BACKGROUND OF THE INVENTION

Various techniques have been developed for the automated mounting of electronic components to printed circuit boards (PCB's). During mounting, substantial forces can be exerted on the PCB by the automated placement head. Accordingly, assembly processing requires back side support of a chosen substrate, such as a circuit board, capable of withstanding such forces. The back side support should provide good, solid support for allowing even and accurate placement of components on the top side of the substrate. Good support is needed where fine-pitched component leads are being placed. The support, however, should also avoid damaging components on the back side of the PCB where a double-sided board is used. Further, evenly distributed support under the placement area assists in avoiding the cracking of solder joints or the breaking of component leads from existing solder joints. This result can occur to previously placed components on the back side of the board, as components on the top side of the board are affixed, if the support is not proper.

One apparatus and method for supporting the back side of a PCB is disclosed in U.S. Pat. No. 5,820,117 (Thompson, et. al.). Here, an air bladder fixture tooling for supporting circuit board assembly processing is detailed. The bladder is positioned below the circuit board within a containment unit adapted for use with conventional railed assembly equipment. While the air bladder may provide uniform back side support, the PCB is not dissuaded from moving, bulging, bending or bowing away from contact with the bladder, especially at those locations distant from the slotted, opposing rails. Therefore, the PCB does not remain in contact with the bladder during component head placement.

Further, the bladder in Thompson is limited to a sole air compartment or chamber. Thus, it can be expected that some portions of the bladder, especially those furthest from the side walls, will "balloon" as the air bladder is inflated. As a result, the support provided by the air bladder furthest from the side walls can be greater than the support provided proximate the side walls of the bladder. Among other drawbacks, support provided by the bladder can be uneven and cause injury to the PCB or components. Also, with a sole chamber, Thompson is limited to a single internal pressure within the air bladder.

Given these limitations of the prior art, there is a clear need for an improved PCB support apparatus and method that overcomes such problems.

SUMMARY OF THE INVENTION

In one aspect, the invention provides an inflatable bladder for supporting a semiconductor substrate.

In one embodiment, the inflatable bladder comprises at least one aperture disposed within the bladder extending from the top exterior surface to the bottom exterior surface of the bladder. In a further embodiment of the inflatable bladder, the inflatable bladder comprises a plurality of apertures disposed within the inflatable bladder and extending from the top exterior surface to the bottom exterior surface. The bladder can further comprise a member for introducing a suction force into the aperture(s), whereby the suction force urges a substrate into contact with the bladder.

In another embodiment, the inflatable bladder further comprises side walls that are pleated or corrugated. In yet another embodiment, the aperture(s) disposed within the inflatable bladder comprise aperture side walls that are pleated or corrugated.

In another embodiment, the inflatable bladder comprises at least one baffle disposed within the inflatable bladder. In further embodiments, the inflatable bladder is secured within the bladder to the top interior surface and bottom interior surface, to the top interior surface and one of the side wall interior surfaces, to the top interior surface and more than one of the side wall interior surfaces, or to the top interior surface, the bottom interior surface, and at least one of the side wall interior surfaces.

In another embodiment, the bladder comprises at least one aperture, a member for introducing a suction force into the aperture(s), and at least one baffle as described above. In other embodiments, the suction introducing member translates the suction force to the aperture(s) to inhibit a semiconductor substrate that is disposed upon the bladder from flexing, bowing, or bending away from contact with the top exterior surface of the inflatable bladder. In still other embodiments, the suction force urges the semiconductor substrate into contact with the inflatable bladder to inhibit the semiconductor substrate from flexing, bowing, or bending away from contact with the top exterior surface of the inflatable bladder. In further embodiments, the side walls of the aperture(s) longitudinally compress. In still further embodiments, the baffle(s) within the bladder are secured within the bladder as described above to inhibit a semiconductor substrate disposed upon the bladder from flexing, bowing, or bending away from contact with the top exterior surface of the inflatable bladder.

In another aspect, the invention provides a fixture apparatus. In one embodiment, the fixture apparatus comprises an inflatable bladder comprising at least one aperture disposed within the inflatable bladder and extending from the top exterior surface to the bottom exterior surface, a member for introducing a suction force into the aperture(s), and a containment structure for retaining the inflatable bladder therein. In yet another embodiment, the fixture apparatus comprises a containment structure comprising a flange and a lip for engaging the flange to secure a portion of the inflatable bladder within the containment structure. In still another embodiment, the fixture apparatus comprises a containment structure that includes a cover plate for selectively covering a portion of the inflatable bladder and reducing the top exterior surface of the inflatable bladder that contacts the semiconductor substrate.

In another embodiment, the inflatable bladder of the fixture apparatus further comprises at least one baffle disposed within the inflatable bladder. In still further embodiments, the inflatable bladder of the fixture apparatus comprises both one or more apertures and one or more baffles. In still another embodiment, the fixture apparatus is associated with a pair of rails, each rail having a slot formed therein and each of the slots configured to receive an opposing edge of a semiconductor substrate. The opposing edges of the semiconductor substrate are slidably supported in the slots of the rails during placement of components on the semiconductor substrate.

In another aspect, the invention provides a system for placing components on a semiconductor substrate. In one embodiment, the system comprises a fixture apparatus comprising an inflatable bladder with at least one aperture disposed therein, a containment structure for retaining the bladder therein, a member for introducing a suction force into the at least one aperture, a pair of rails containing slots for receiving opposing edges of a semiconductor substrate, a base plate for providing vertical movement or translation of the fixture apparatus, and a placement head for placing components onto the semiconductor substrate. In another embodiment of the system, the inflatable bladder can also comprise at least one baffle within the bladder.

In another aspect, the invention provides a method of supporting a semiconductor substrate. In one embodiment, the method comprises providing an inflatable bladder that comprises at least one aperture and, optionally, at least one baffle disposed therein, positioning the semiconductor substrate proximate the top exterior surface of the inflatable bladder, and introducing a suction force into the aperture(s) of the bladder to secure the semiconductor substrate to the top exterior surface of the inflatable bladder. In another embodiment, the method further comprises positioning the semiconductor substrate in slots located within a pair of rails, the slots being positioned on either side of the bladder, such that the semiconductor substrate is proximate the top exterior surface of the inflatable bladder.

In another embodiment, the method further comprises preventing the semiconductor substrate from bending, bowing, or flexing away from contact with the inflatable bladder during component placement. In yet another embodiment, the method further comprises expelling the supply of fluid from the inflatable bladder such that the inflatable bladder deflates, and thereafter, transporting the semiconductor substrate to a subsequent step in the semiconductor assembly process. The method can also comprise adjusting the suction force introduced into the aperture(s) to permit the suction pressure to be increased or decreased. Further, the method may include segregating the cavity within the inflatable bladder using the baffle(s) and thereby creating separate chambers within the inflatable bladder. By incorporating an aperture, check valve, or like device into the baffle(s), the baffle(s) can permit distribution of the suction force within the chambers such that the suction force in the chambers is approximately equal.

BRIEF DESCRIPTION OF THE DRAWINGS

Embodiments of the invention are described below with reference to the following accompanying drawings, which are for illustrative purposes only. The invention is not limited in its application to the details of construction or the arrangement of the components set forth in the following description or illustrated in the drawings. The invention is capable of other embodiments or of being practiced or carried out in other various ways. Also, it is to be understood that the terminology and phraseology employed herein is for purpose of description and illustration and should not be regarded as limiting. Like reference numerals are used to indicate like components.

FIG. 1 is a perspective view of an embodiment of a fixture apparatus according to the invention illustrating an inflatable bladder mounted in a containment structure and possessing an external suction gallery.

FIG. 1A is a perspective view of the inflatable bladder of the fixture apparatus of FIG. 1 without a containment structure or external gallery.

FIG. 1B is a cross-sectional, side elevational view of the inflatable bladder depicted in FIG. 1A taken along line 1B–1B illustrating the walls and surfaces of the inflatable bladder.

FIG. 6 is a cross-sectional, side elevational view of the inflatable bladder depicted in FIG. 5, taken along line 6—6, illustrating the pleated side walls and pleated apertures.

FIG. 7 is a perspective view of an embodiment of the inflatable bladder comprising both apertures and baffles within the bladder.

FIG. 8 is a top plan view of the inflatable bladder of FIG. 7 further illustrating the apertures and baffles within the bladder.

FIG. 9 is a cross-sectional, side elevational view of the inflatable bladder depicted in FIG. 8, taken along line 9—9, further illustrating the apertures and baffles within the bladder.

FIG. 10 is a top plan view of another embodiment of an inflatable bladder according to the invention illustrating the inflatable bladder with both apertures and baffles.

FIG. 11 is a perspective view of another embodiment of an inflatable bladder according to the invention, without apertures, illustrating baffles within the bladder.

FIG. 12 is a cross-sectional, side elevational view of another embodiment of an inflatable bladder of the invention with converging apertures disposed within the inflatable bladder.

DETAILED DESCRIPTION OF THE PREFERRED EMBODIMENT

Figure 2:
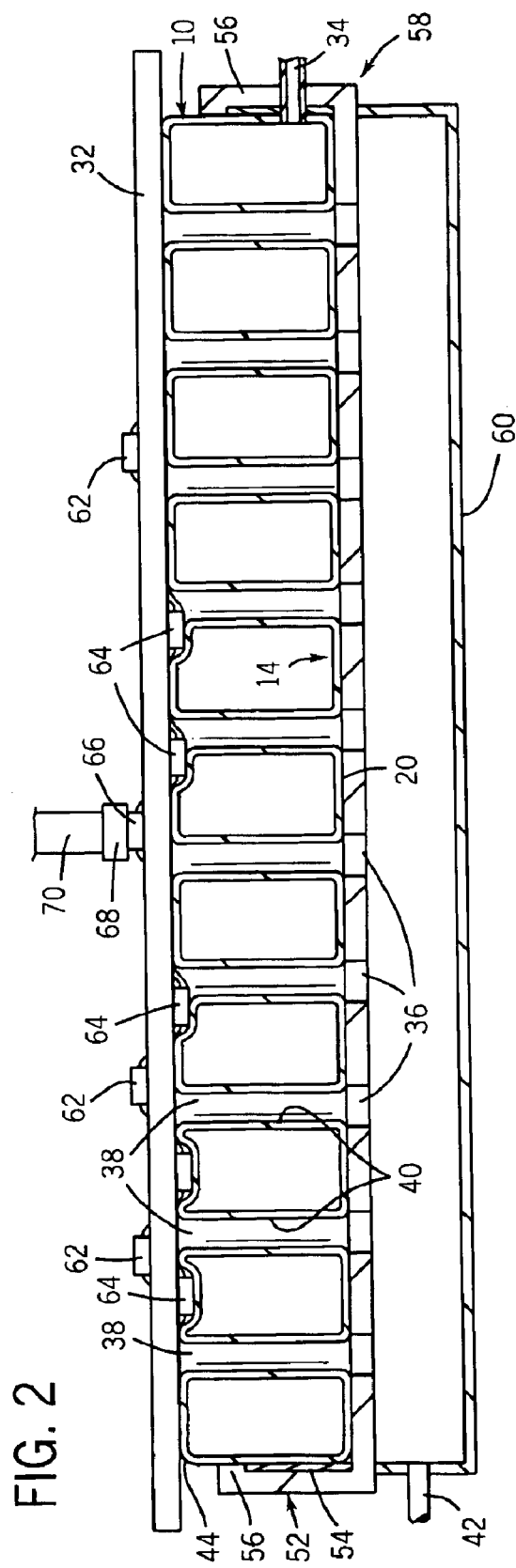
FIG. 2 is an elevational view of the fixture apparatus depicted in FIG. 1, taken along line 2—2, illustrating the inflatable bladder mounted in a containment structure as the inflatable bladder supports a semiconductor substrate during a component placement process.

The invention will be described generally with reference to the drawings for the purpose of illustrating the present preferred embodiments only and not for purposes of limiting the same. The figures illustrate processing steps for use in the fabrication of semiconductor devices in accordance with the present invention. It should be readily apparent that the processing steps are only a portion of the entire fabrication process.

In the current application, the terms "semiconductive wafer fragment" or "wafer fragment" or "wafer" will be understood to mean any construction comprising semiconductor material, including but not limited to bulk semiconductive materials such as a semiconductor wafer (either alone or in assemblies comprising other materials thereon), and semiconductive material layers (either alone or in assemblies comprising other materials). The term "substrate" refers to any supporting structure including, but not limited to, the semiconductive wafer fragments or wafers described above.

While a substrate can include a plurality of conventional semiconductor substrates known in the microelectronics or semiconductor industry, as an illustrative example only, a semiconductor substrate known as a printed circuit board (PCB) will be used to further describe the invention.

Referring to FIGS. 1, 1A, and 1B, inflatable bladder 10 comprises a top wall 12, a bottom wall 14, and side walls 16. The top wall 12, bottom wall 14, and side walls 16 define a top exterior surface 18, a bottom exterior surface 20, and side wall exterior surfaces 22, respectively, that are the external surfaces of inflatable bladder 10. The top wall 12, bottom wall 14, and side walls 16 further define a top interior surface 24, a bottom interior surface 26, and side wall interior surfaces 28, respectively, that are disposed within inflatable bladder 10 and oppose complimenting exterior surfaces. The interior surfaces, in combination, define a cavity 30 within inflatable bladder 10. When a PCB 32 is positioned onto inflatable bladder 10, the top wall 12, and specifically the top exterior surface 18, of inflatable bladder 10 support the PCB 32. The top wall 12 of inflatable bladder 10 should be pliable and sufficiently accepting of components that may be disposed on the PCB and come into contact with top wall 12.

Figure 5:
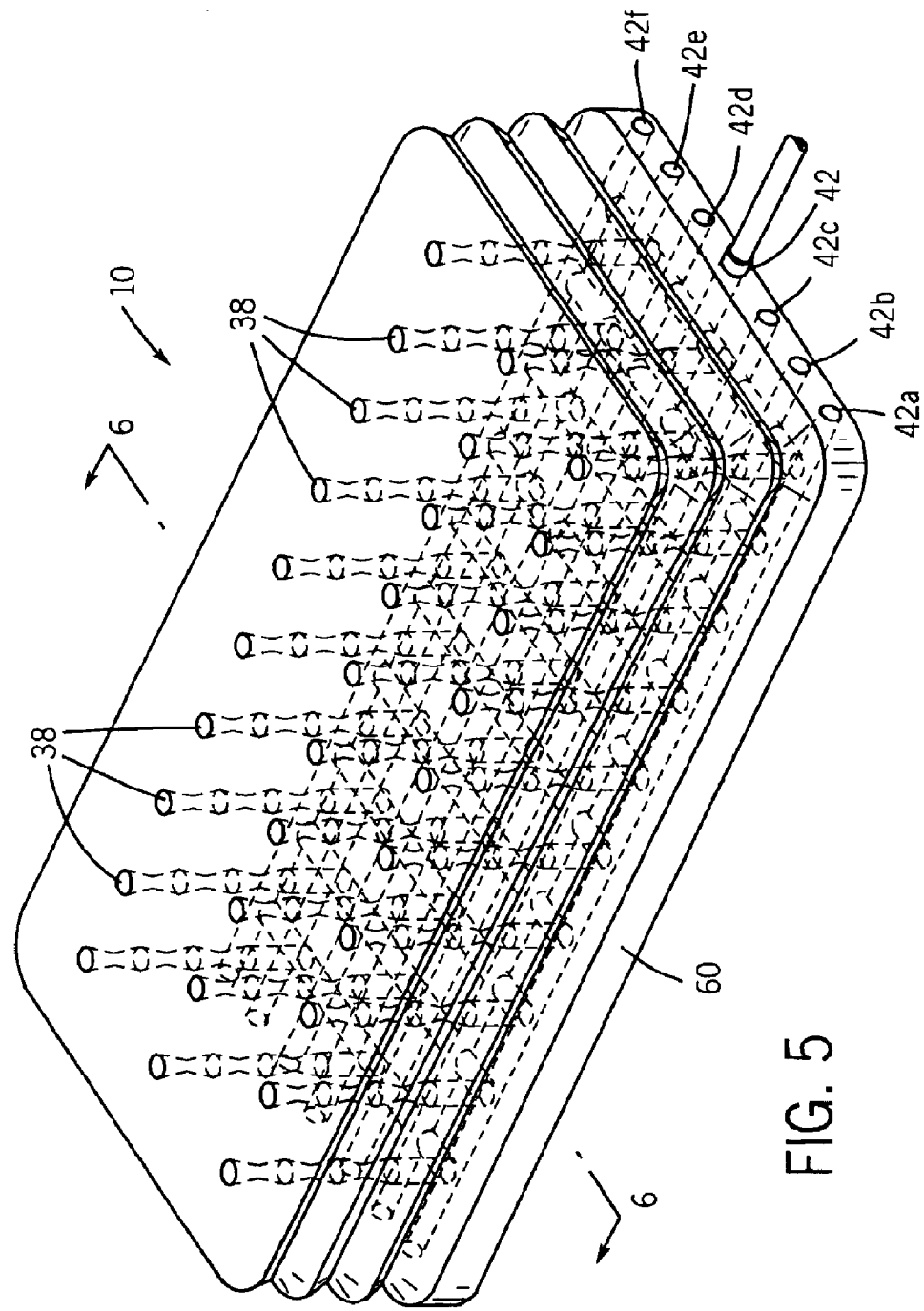
FIG. 5 is a perspective view of another embodiment of an inflatable bladder comprising pleated side walls, as well as apertures and a suction gallery internal to the inflatable bladder.

The cavity 30 within inflatable bladder 10 permits inflatable bladder to receive and contain fluids. Thus, inflatable bladder 10 further comprises supply tube 34 for introducing a fluid into the cavity 30 to inflate inflatable bladder 10. Supply tube 34 can be mounted to inflatable bladder 10 in various locales, such as a side wall, as shown in FIGS. 2 and 5, or bottom wall 14 of inflatable bladder 10 (not shown). Supply tube 34 permits inflatable bladder 10 to be selectively inflated and deflated as desired for supporting a semiconductor substrate. Inflation of inflatable bladder 10 can be accomplished using a variety of fluids, including a gas or liquid. Examples of suitable gases include air, oxygen, and nitrogen. Examples of suitable liquids include water and oil. Although a fluid is supplied by supply tube 34, other means such as hoses, pipes, conduits, channels, ducts, or the like are contemplated as suitable alternatives for providing fluid therethrough to the bladder.

At least the top wall 12 of inflatable bladder 10 is comprised of a pliable material for receiving components 62, 64 disposed on the surface of PCB 32. For example, the walls of the inflatable bladder can comprise a vulcanized rubber, a polyurethane material, or a coated fabric such as vinyl. Further, the walls of inflatable bladder 10 can be comprised of materials adapted to provide proper electrostatic discharge safety features, for example a carbon impregnated vinyl. Likewise, inflatable bladder 10 can be contained within such materials, or portions of such materials can be secured to the exterior surfaces of the inflatable bladder. Notably, the top wall 12, the bottom wall 14, or side walls 16 of inflatable bladder 10 can comprise several layers of material. In another embodiment, the walls of inflatable bladder 10 have a thickness of about 0.03 to about 0.05 of an inch (about 0.76 to about 1.26 mm). The thickness of the walls permits inflatable bladder 10 to conform to irregularities existing due to components 62, 64 on a PCB 32 and still render support as components 62, 64 are placed on the top exterior surface 18. The thickness of the walls of inflatable bladder 10 can also be dictated by the physical properties of the material, such as pliability, strength, and conformance. While a variety of fluid pressures within inflatable bladder 10 are contemplated, the pressure should adequately permit inflatable bladder 10 to conform to irregularities of a wide range of components 62, 64 placed on the PCB 32. For example, the inflatable bladder 10 can be inflated with a gas, namely air, to achieve approximately 2 to 30 pounds per square inch of pressure.

Figure 3:
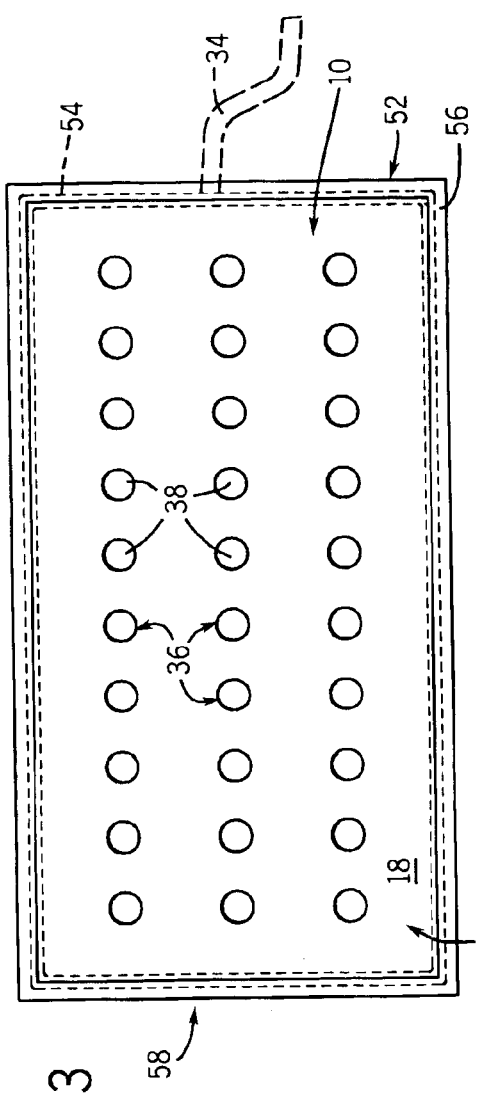
FIG. 3 is a top plan view of the fixture apparatus of FIG. 1, illustrating the inflatable bladder mounted in a containment structure.

Inflatable bladder 10 has a peripheral dimension that defines side walls 16. The side walls 16 can permit inflatable bladder 10 to take a variety of geometric shapes when observing the inflatable bladder 10 from a top plan view. Such a top plan view is illustrated in FIG. 3. Inflatable bladder 10 can be substantially coextensive with the peripheral dimensions of an overlying PCB 32.

Referring to FIGS. 1 through 6, a plurality of apertures 36 have been incorporated into inflatable bladder 10. Apertures 36 are generally disposed within inflatable bladder 10 and extend from, and through, the top exterior surface 18 to the bottom exterior surface 20 of the inflatable bladder. Thus, the apertures 36 define a pair of distal aperture openings 38, one opening typically being disposed on the top exterior surface 18 and the other opening being disposed on the bottom exterior surface 20. The apertures 36 are defined by aperture side walls 40, the side walls 40 extending from the top exterior surface 18 to the bottom exterior surface 20 of inflatable bladder 10. The apertures 36 comprise aperture openings 38 that allow communication of a suction force, otherwise described as suction pressure, negative force, or vacuum force, from a suction tube 42 to the opening 38 of each aperture 36 at the top exterior surface 18 of inflatable bladder 10. The apparatus or means for creating the suction force can be a vacuum device or any other means known in the art for creating a negative, or suction, pressure.

One aperture 36, or multiple apertures 36, can be incorporated into inflatable bladder 10 and, as illustrated in FIGS. 1, 3, and 5, a plurality of apertures 36 has been provided. Apertures 36 with individual characteristics and in various configurations can be employed. The plurality of apertures 36 can comprise a distinct symmetrical pattern of individual apertures 36 equally spaced from each other across inflatable bladder 10 at either the top exterior surface 18 or bottom exterior surface 20. Likewise, each aperture 36 can be of equal size and shape with respect to other apertures 36. However, it is also contemplated that each aperture 36 in the plurality of apertures 36 can be arrayed or grouped in any fashion, can be random, or can otherwise be dissimilar. Each aperture 36 can have a constant or variable axial cross section. Likewise, each aperture 36 can have aperture side walls 40 of a variable, longitudinal lengths, depending on the depth of the inflatable bladder 10 at the respective locale or the expansion of an aperture 36. Each aperture 36 can have an axial cross section at either the top exterior surface 18 or the bottom exterior surface 20, or somewhere in between, that is round, square, rectangular, polygonal, or irregular polygonal. As such, the diameter of an aperture 36, or the distance between aperture side walls 40, can vary in a sole aperture or among several apertures. Further, while the apertures 36 are depicted as having a longitudinal axis perpendicular to the top or bottom wall 12,14 of inflatable bladder 10, this is not required and the apertures 36 can be angled or tilted.

Additionally, two or more apertures 36 can converge within inflatable bladder 10, at the top exterior surface 18, or at the bottom exterior surface 20, as depicted in FIG. 12. In such cases, a plurality of aperture openings 38 is found at one exterior surface of inflatable bladder 10, while as few as one aperture opening is found at the other exterior surface.

The side walls of each aperture 40 in the plurality of apertures 36 can comprise the same or a different material as the walls of inflatable bladder 10. The side walls 40 of apertures are integrally formed with inflatable bladder 10. Alternatively, each side wall 40 of an aperture can comprise its own distinct material and even be formed separately from inflatable bladder 10. Depending on the components 62, 64 found on the PCB 32, each side wall 40 of an aperture can be more stiff and rigid than the walls of inflatable bladder 10 if no injury to components 62, 64 is likely.

Should a more rigid or inflexible aperture material be chosen, it is contemplated that the apertures will increasingly prevent "ballooning". Ballooning can occur when inflatable bladder 10 is inflated and top wall 12 or top exterior surface 18 of the inflatable bladder unevenly vertically expands with respect to the bottom wall 14 or bottom exterior surface 20. As one example, a portion 44 of inflatable bladder 10 illustrated in FIG. 2 depicts ballooning. The ballooning effect can be more prevalent near the central, unsupported areas of an inflated object (not shown). For example, as a rectangular inflatable bladder 10, as illustrated in FIGS. 1–3, expands due to increasing interior pressure, the inflatable bladder 10 can have a tendency to permit the top exterior and bottom exterior surfaces 18, 20 to bulge outwardly and become hemispherical. However, apertures 36 with their respective side walls 40, illustrated in FIG. 2, as they are distributed within the inflatable bladder 10, can help prevent ballooning of the inflatable bladder 10. Thus, apertures 36 can encourage or achieve a more relatively planar top exterior surface 18 for inflatable bladder 10 as opposed to an inflatable bladder 10 without apertures 36. Although some ballooning can still occur, apertures 36 that are distributed across the top exterior surface 18 of inflatable bladder 10, with their respective side walls 40, will segment the top exterior surface 18 of the inflatable bladder 10 and reduce the magnitude of the bulging. The amplitude and frequency of peaks and troughs formed by ballooning across the top exterior surface 18 of inflatable bladder 10 can be found to be acceptable when the side walls of apertures 40 maintain top wall 12 of the inflatable bladder 10 in a substantially planar configuration. This result occurs because the aperture side walls 40 reach a limit of expansion as their length increases and the top wall 12 of the inflatable bladder 10 is prevented from expanding further outward.

In another embodiment of inflatable bladder 10, as illustrated in FIGS. 5 and 6, the plurality of apertures 36 comprise aperture side walls 40a, or a portions thereof, that are pleated, corrugated, or otherwise "accordion-like". By using apertures of this design, the side walls 40a of the apertures 36 are inhibited from constricting when a suction force is introduced into inflatable bladder 10 and transported through the apertures 36 to the top exterior surface 18 of the inflatable bladder 10. As a suction force is increased and decreased, each aperture 36 can longitudinally expand or compress, respectively, instead of axially constricting. With no ability to longitudinally expand and compress, the suction pressure could become so great as to cause the aperture walls 40 to constrict such that they close the aperture 36. This would effectively reduce or block entirely the suction pressure being communicated through the aperture. Thus, with the aid of pleated aperture side walls 40a, suction can continue to be transported to the aperture openings 38 even as the suction pressure increases.

Further, a means or mechanism such as a lift table 70 for vertically lifting inflatable bladder 10 may not be required to place the inflatable bladder 10 in contact with the PCB 32. As fluid is introduced into inflatable bladder 10 by supply tube 34, the pleated side walls 16a are permitted to expand, and if the inflatable bladder 10 is in close proximity to the PCB 32, the PCB 32 will be contacted by the expanding inflatable bladder 10. Conversely, as a fluid is discharged from inflatable bladder 10 by reversing the flow of fluid through supply tube 34, the pleated side walls 16a of the bladder 10 retract and permit vertical constriction of the inflatable bladder 10. Thus, contact between an inflatable bladder 10 and a PCB 32 can be terminated and the PCB 32 thereafter transported to a subsequent processing step.

Once inflatable bladder 10 is inflated to a desired pressure, the bladder 10 can remain inflated while processing the next PCB 32 in an assembly line. The inflatable bladder 10 can also remain inflated and accept a PCB assembly 32 that possesses an entirely different component configuration. The pliability of inflatable bladder 10 permits universal acceptance of PCB's 32 comprising differing components such that the PCB 32 is securely held to the top exterior surface 18 by suction from the apertures 36.

In another embodiment, inflatable bladder 10 can be structured to contain one or more baffles 46, as illustrated in FIGS. 7–10. Baffles 46 form an interior wall of material contained within inflatable bladder 10, and can be attached to the top interior surface 24, the bottom interior surface 26, and/or one or more of the side wall interior surfaces 28. In embodiments where baffles 46 are connected to top interior surface 24 and either bottom interior surface 26 or one or more of the side wall interior surfaces 28, the top wall 12 of inflatable bladder 10 can be prevented or inhibited from ballooning and becoming hemispherical when inflatable bladder 10 is inflated. By varying the distribution of baffles 46, effects of top exterior surface ballooning can be reduced. Although some ballooning can still occur, the amplitude and frequency of peaks and troughs across the top exterior surface 18 are reduced such that the inflated bladder 10 more evenly receives PCB 32 thereon.

By attaching baffles 46 to interior surfaces 24, 26, 28, separate chambers 48 can be created within inflatable bladder 10 as illustrated in FIGS. 7–9 and 11. Respective supply tubes 34 can independently feed these chambers 48, thus allowing the separate chambers 48 to possess distinct pressures within each chamber 48. This can be especially beneficial where components previously placed on PCB 32 are of different heights or sizes. In another embodiment, baffles 46 within inflatable bladder 10 can comprise an opening 50 or slot, as illustrated in FIG. 11, or other device such as a pneumatic valve or check valve. The opening 50 or other such device can permit negative pressure to traverse baffles 46 and be approximately evenly distributed throughout various chambers 48 in the cavity 30 of the inflatable bladder 10. Thus, an approximately equal pressure can be maintained throughout the cavity 30 despite the presence of baffles 46.

Notably, baffles 46 can be constructed of a material that is the same or different than the material of the inflatable bladder 10. Baffles 46 need not extend entirely across inflatable bladder 10, as illustrated in FIG. 11, and can be fashioned as segments of material that are triangular, rectangular, square, contoured, or otherwise when shaped.

In another embodiment, the apertures 36 and baffles 46 as described can be used in combination in a single inflatable bladder 10 as illustrated in FIG. 7. The independent functions and benefits of apertures 36 and baffles 46 can, in a single embodiment, be merged and perform in harmony.

Figure 4:
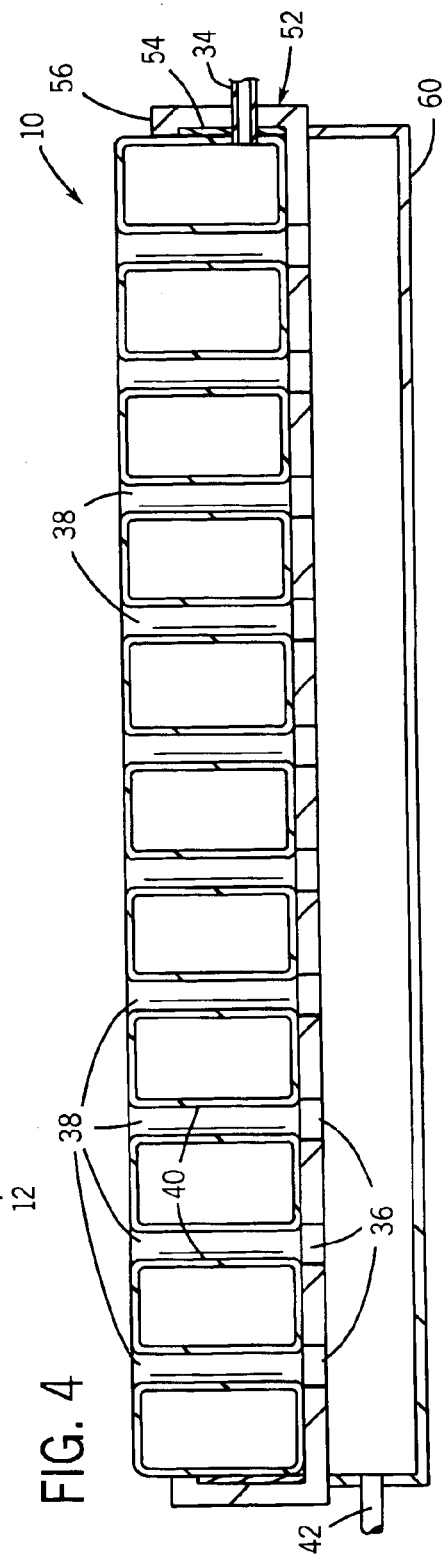
FIG. 4 is a cross-sectional, side elevational view of the fixture apparatus of FIG. 3 taken along line 4—4 illustrating apertures within the inflatable bladder and the suction gallery external to the containment structure.

In another aspect of the invention, inflatable bladder 10 can be disposed within a containment structure 52 to form a fixture apparatus 58 (FIGS. 2–4). To encourage inflatable bladder 10 to remain in containment structure 52 as the inflatable bladder 10 is inflated and deflated, at least a portion of the side walls 16 of the inflatable bladder 10 can be contacted by flange strip 54 as shown in FIGS. 2 and 3. Flange strip 54 can be attached around, or formed as part of, inflatable bladder 10. Inflatable bladder 10 is secured in containment structure 52 by flange strip 54 and lip 56 acting in combination. Lip 56 catches flange strip 54 and thereby holds inflatable bladder 10 within containment structure 52. The bottom wall 14 or bottom exterior surface 20 of inflatable bladder 10 can be secured to containment structure 52.

Depending on the rigidity or stiffness of side walls 16 of inflatable bladder 10, it is contemplated that containment structure 52 may not be necessary for supporting the inflatable bladder 10. This is particularly true where inflatable bladder 10 comprises pleated side walls 16a as illustrated in FIGS. 5–6. Also, since inflatable bladder 10 is constructed to expand and constrict vertically by virtue of the pleats, both a containment structure 52 and a means for vertical displacement or movement of the inflatable bladder 10 may be unnecessary.

The suction force that exists within apertures 36, as noted above, can be introduced into a suction gallery 60 by using suction tube 42. A "quick connect" or other connecting device known in the art can associate the suction tube 42 with the vacuum source (not shown). The suction tube 42 or tubes can be received by inflatable bladder 10 at any locale, such as one of the side walls 16 as illustrated in FIG. 4, or the bottom wall 14 (not shown). Suction tube 42 can terminate at the entrance of suction gallery 60, or it can extend into the suction gallery 60. Should it be desired that suction tube 42 extend into suction gallery 60, it can be fragmented to create a series of suction tubes, 42a, 42b, 42c, 42d, 42e, and 42f, as illustrated in FIG. 5. No matter which embodiment is chosen, so long as suction can be communicated from the vacuum source to the opening 38 of individual apertures 36 at the top exterior surface 18 of inflatable bladder 10, the suction tube 42 or tubes can be configured as desired. Although suction is provided by a tube 42 or tubes, other means such as hoses, pipes, conduits, channels, ducts, or the like are contemplated as suitable alternatives for providing suction. The tube or other element should provide sufficient rigidity or other characteristics to inhibit the tube from collapsing as the suction force is introduced.

Suction gallery 60 can be an external attachment to inflatable bladder 10, as illustrated in FIGS. 2 and 4, or the suction gallery 60 can be formed with the inflatable bladder in a solitary unit as depicted in FIG. 5. In another embodiment, suction gallery 60 can also be located within containment structure 52 (not shown), or outside the containment structure as illustrated in FIG. 2.

In embodiments employing an internal suction gallery and a series of suction tubes, such as the embodiment of FIG-5, the series of suction tubes are directly connected to the associated apertures 36. As such, the bottom exterior surface 146f inflatable bladder 10 is defined to be the top of the suction gallery or suction tubes. Thus, although the apertures 36 do not penetrate bottom wall 14 of inflatable bladder 10, they still extend from a top exterior surface to a bottom exterior surface of the inflatable bladder 10 as defined in these embodiments.

Referring to FIG. 2, in use a typical inflatable bladder 10 is inflated courtesy of supply tube 34 and a suction force is introduced into suction gallery 60 and associated apertures 36. When PCB 32 and inflatable bladder 10 come into contact, the inflatable bladder 10 provides support for the PCB 32 while components 62, 64 are being placed on the PCB 32. Further, the suction force translated to aperture openings 38 on the top exterior surface 18 acts to capture the PCB 32 and hold it securely against inflatable bladder 10. Thus, the PCB 32 is upwardly supported by inflatable bladder 10 and pulled or urged downwardly toward the inflatable bladder 10 by suction at the aperture openings 38. In one embodiment, both the support provided by inflatable bladder 10 and the pull provided by the suction force through the apertures 36 is approximately evenly distributed over portions of the PCB 32 in contact with the inflatable bladder 10. Thus, as component 62,64 placement occurs, the PCB 32 is retained without injuring components 62, 64 in contact with the top wall 12 and the PCB 32 is inhibited from bowing, flexing or bending away from contact with the top exterior surface 18 of the inflatable bladder 10.

As illustrated in FIG. 2, an inflatable bladder 10, as part of fixture apparatus 58 including an external gallery 60, is shown in operation in a characteristic embodiment. FIG. 2 depicts a partially cut-away elevational view of an inflatable bladder 10 and associated components 62, 64 as the inflatable bladder 10 supports PCB 32 during component 62, 64 placement on the PCB 32. As shown in FIG. 2, PCB 32 can include top side components 62 and back side components 64. These components 62, 64 can comprise a variety of electrical structures or parts known in the art to be placed on semiconductor substrates. One particular top side component, component 66, is shown in FIG. 2 being placed on PCB 32 by placement head 68. Placement head 68 is mounted on manipulator arm 70, and in turn, manipulator arm is connected to a conventional, automated placement system such as is well known in the art. Because PCB's 32 have some flexibility, as component 62, 64 placement occurs, PCB 32 can have a tendency to flex, bow, or bend. However, in locations where back side components 64 are mounted on PCB 32, inflatable bladder 10 easily conforms to the component shapes and supports the PCB 32. As such, damage to PCB 32 and components 62, 64 is avoided while support for the PCB 32 continues.

Figure 13:
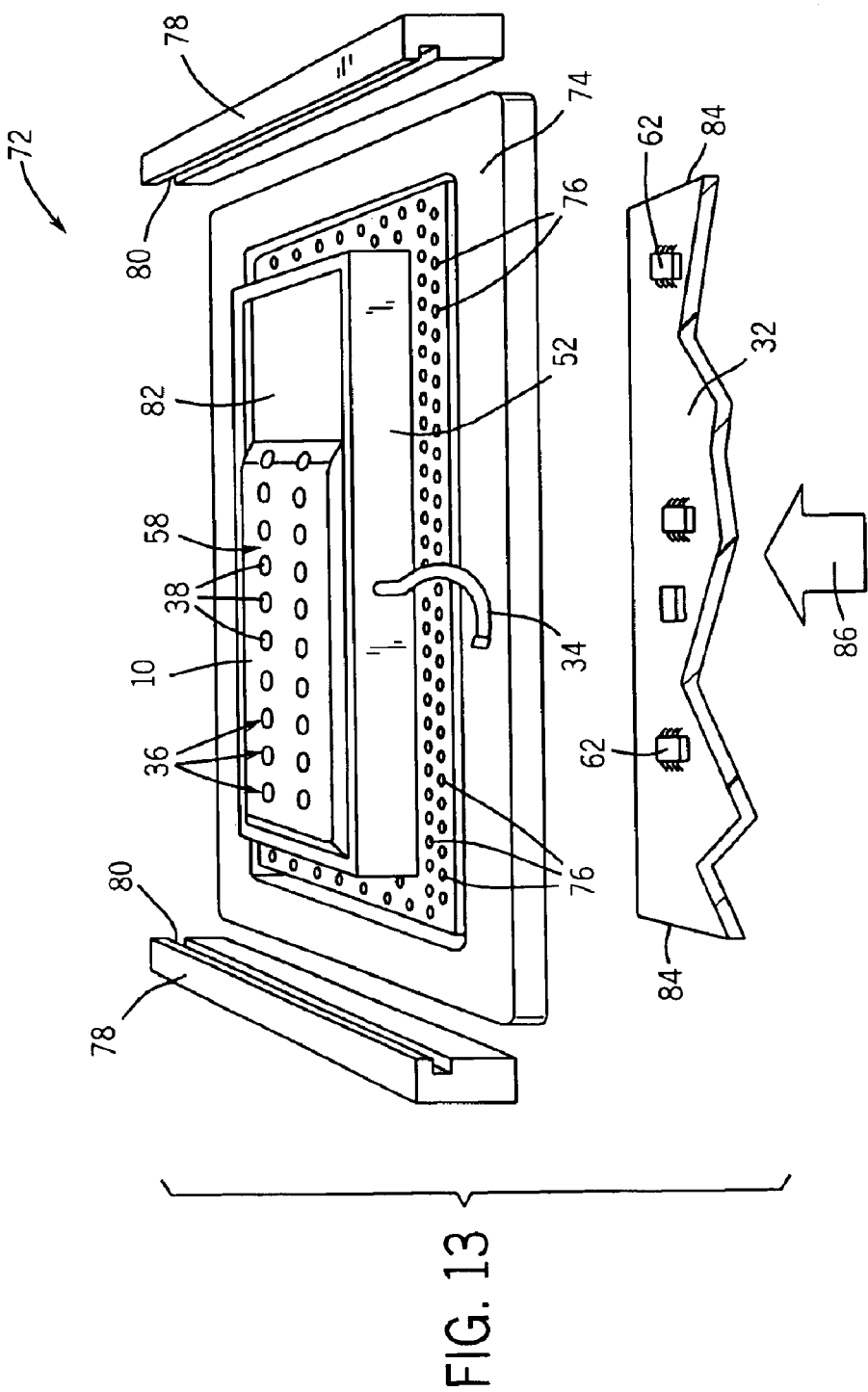
FIG. 13 is a front perspective (partial section) view of an embodiment of a system according to the invention illustrating the fixture apparatus of FIG. 1 as opposing edges of a semiconductor substrate are introduced into the slots located within a pair of rails in a railed assembly.

As illustrated by the system shown in FIG. 13, inflatable bladder 10 and containment structure 52 (i.e. the fixture apparatus 58) are shown in association with a railed assembly 72. As depicted, railed assembly 72 comprises rails 78 and lift table 74. Containment structure 52 can be secured to lift table 74, otherwise known as a base plate, by any conventional means. For example, pins can be attached to the bottom of containment structure 52, and subsequently inserted into lift table holes 76 contained within the lift table 74, or the containment structure 52 can be directly secured to the lift table 74 by any conventional means. Railed assembly 72 can be any conventional railed assembly known in the art for PCB 32 assembly, and more specifically for PCB 32 component placement purposes. In one embodiment, railed assembly 72 comprises rails 78, slots 80, and lift table 74, as well as fixture apparatus 58. Each rail 78 in the pair of rails includes a slot 80 for receiving and retaining PCB 32 during component 62, 64 placement. Typically, the edges 84 of PCB 32 are placed in slots 80 above lift table 74 to hold the PCB 32 for assembly after the PCB 32 is slid or maneuvered into place in the rails 78. As PCB 32 is, for example, slid forward as indicated by the directional arrow 86 in FIG. 13, a fixture apparatus 58 according to the invention, which is disposed on lift table 74 becomes positioned below the PCB 32.

Although an acceptable length dimension of inflatable bladder 10 is substantially similar to a length of PCB 32, the length can be easily smaller or larger than the length of the PCB 32 and still provide support. In the example illustrated in FIG. 13, a substantially coextensive inflatable bladder 10 is slightly smaller in width than PCB 32 to allow inflatable bladder 10 to fit within rail assembly 72. Where the edges 84 of PCB 32 are already solidly supported, such as in a conventional rail system, it is not detrimental for inflatable bladder 10 to be substantially smaller than the PCB 32. Although inflatable bladder 10 is shown as being used in this particular railed assembly configuration, the inflatable bladder 10 could also be used for supporting other semiconductor substrates in different assembly configurations.

FIG. 13 also shows an embodiment of containment structure 52 wherein adjustable cover plate 82 is placed over a portion of inflatable bladder 10 in the containment structure 52. Adjustable cover plate 82 can be used to confine a portion of inflatable bladder 10 within containment structure 52 such that the inflated surface area of inflatable bladder 10 is selectively reduced to a smaller area. This feature allows inflatable bladder 10 to be adjustably confined within containment structure 52 to easily adapt to different sized circuit boards. Specifically, if a PCB 32 has a length shorter than inflatable bladder 10, and is positioned for assembly, adjustable cover plate 82 can be used to keep inflatable bladder 10 from protruding upwardly near the edge of the circuit board. Thus, potential injury, manufacturing disruption, or damage to the inflatable bladder can be avoided. Accordingly, cover plate 82 is adjustable relative to containment structure 52, and can comprise a variety of conventional plates capable of retaining inflatable bladder 10 within the containment structure 52. For example, adjustable cover plate 82 can be a metal plate having a lip feature (not shown) for interlocking with containment structure 52.

As described and illustrated, the adaptability of the fixture apparatus 58 with the included inflatable bladder 10 has been demonstrated. Both the inflatable bladder 10 and the fixture apparatus 58 can conform to existing assembly equipment and provide an easy-to-use means for setting-up assembly operations. Further, inflatable bladder 10 can conform to a plurality of component configurations found on a PCB 32, provide support for a PCB 32, and secure a PCB 32 to the inflatable bladder 10.

In compliance with applicable statutes, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of supporting a substrate, comprising the steps of:
    providing an inflatable bladder comprising an aperture extending therethrough from a top surface to a bottom surface;
    placing the substrate over the top surface of the bladder; and
    applying a suctioning force to the aperture at the bottom surface of the bladder to draw air through the aperture and the substrate downward onto the top surface of the bladder.

2. A method of supporting a substrate for placement of a component thereon, comprising the steps of:
    providing an inflatable bladder comprising a structure for passage of air therethrough to inflate the bladder, and an aperture extending through the bladder from a top surface to a bottom surface;
    positioning a substrate over the top surface of the bladder;
    flowing air into the bladder to inflate the bladder and bring the top surface into contact with the substrate;
    applying a suctioning force to draw air through the aperture at the bottom surface of the bladder and the substrate downward onto the top surface of the bladder.

3. A method of supporting a substrate, comprising the steps of:
    providing an inflatable bladder comprising one or more apertures extending therethrough from a top surface to a bottom surface;
    placing the substrate over the top surface of the bladder; and
    applying a suctioning force to the apertures at the bottom surface of the bladder to draw air through the apertures and the substrate downward onto the top surface of the bladder.

4. The method of claim 3, wherein the bladder comprises a plurality of apertures on a top surface.

5. The method of claim 3, wherein the bladder comprises a plurality of apertures on the top surface, with one or more of the apertures converging into a common aperture at the bottom surface.

6. The method of claim 3, wherein the bladder comprises pleated sidewalls.

7. A method of supporting a substrate for placement of a component thereon, comprising the steps of:
    providing an inflatable bladder comprising a structure for passage of air therethrough to inflate the bladder and an aperture extending through the bladder from a top surface to a bottom surface, and a suction gallery attached at the bottom surface of the bladder, the suction gallery comprising a chamber in fluid flow communication with the aperture of the bladder;
    positioning a substrate over the top surface of the bladder; and
    applying a suctioning force to the suction gallery to draw air through the aperture and the substrate downward onto the top surface of the bladder.

8. A method of supporting a substrate for placement of a component thereon, comprising the steps of:
    providing an inflatable bladder having a suction gallery attached thereto, the bladder comprising a structure for passage of air therethrough to inflate the bladder and an aperture extending through the bladder from a top surface to a bottom surface, and the suction gallery comprising a chamber in fluid flow communication with the aperture of the bladder and a structure for passage of air therethrough from the chamber;
    attaching a suctioning device to the air passage structure of the suction gallery;
    positioning a substrate over the top surface of the bladder; and
    applying a suctioning force through the air passage structure of the suction gallery to draw air through the aperture and the substrate downward onto the top surface of the bladder.

9. A method of supporting a substrate for placement of a component thereon, comprising the steps of:
providing an inflatable bladder comprising a structure for passage of air therethrough to inflate the bladder, an aperture extending through the bladder from a top surface to a bottom surface, and a suction gallery situated at the bottom surface of the bladder, the suction gallery comprising a chamber in fluid flow communication with the aperture of the bladder and a structure for passage of air therethrough from the chamber;
positioning a substrate over the top surface of the bladder; and
applying a suctioning force to the air passage structure of the suction gallery to draw air through the aperture and the substrate downward onto the top surface of the bladder.

10. A method of supporting a substrate for placement of a component thereon, comprising the steps of:
providing an inflatable bladder comprising an aperture extending therethrough, the aperture having a first end opening to a top surface of the bladder, and a second end opening to a suction chamber having a structure for passage of air therethrough from the chamber;
positioning a substrate over the top surface of the bladder; and
applying a suctioning force to the air passage structure of the suction chamber to draw air through the aperture and the substrate downward onto the top surface of the bladder.

11. A method of supporting a substrate for placement of a component thereon, comprising the steps of:
providing an inflatable bladder comprising an aperture extending therethrough, the aperture having a first end opening to a top surface of the bladder, and a second end opening to a suction chamber having a structure for passage of air therethrough from the chamber;
attaching a suctioning device to the air passage structure of the suction chamber;
positioning a substrate over the top surface of the bladder; and
applying a vacuuming force through the air passage structure to draw air from the aperture and the substrate downward onto the top surface of the bladder.

12. A method of supporting a substrate for placement of a component thereon, comprising the steps of:
providing an inflatable bladder comprising an aperture extending therethrough from a top surface to a bottom surface;
positioning the bladder on a support structure operable to move the bladder in a vertical direction;
positioning a substrate over the top surface of the bladder; and
applying a vacuuming force to the bottom surface of the bladder to draw air from the aperture and the substrate downward onto the top surface of the bladder.

13. A method of supporting a substrate for placement of a component thereon, comprising the steps of:
providing an inflatable bladder comprising an aperture extending therethrough, the aperture having a first end opening to a top surface of the bladder, and a second end opening to a chamber of a suction gallery situated at the bottom surface of the bladder, the suction gallery having a structure for passage of air therethrough from the chamber;
attaching a suctioning device to the air passage structure of the suction chamber;
positioning a substrate over the top surface of the bladder; and
applying a suctioning force to draw air from the aperture and draw the substrate downward onto the top surface of the bladder.

14. A method of supporting a substrate for placement of a component thereon, comprising the steps of:
providing an inflatable bladder situated within a containment structure, the bladder comprising an aperture extending therethrough from a top surface to a bottom surface;
positioning a substrate over the top surface of the bladder; and
applying a suctioning force to draw air from the aperture and draw the substrate downward onto the top surface of the bladder.

15. A method of supporting a substrate for placement of a component thereon, comprising the steps of:
providing an inflatable bladder situated within a containment structure, the bladder comprising an aperture extending therethrough from a top surface to a bottom surface;
positioning the bladder on a support structure operable to move the bladder in a vertical direction;
positioning a substrate over the top surface of the bladder; and
applying a suctioning force to draw air from the aperture and draw the substrate downward onto the top surface of the bladder.

16. A method of supporting a substrate for placement of a component thereon, comprising the steps of:
providing an inflatable bladder comprising an aperture extending therethrough from a top surface to a bottom surface;
positioning the bladder within a containment structure comprising two rails with the bladder situated therebetween, each of the rails having a slot extending lengthwise along the rail and oriented toward the bladder, the slots sized for slidably receiving the substrate therethrough to position the substrate over the top surface of the bladder;
positioning the substrate in the slots of the rails and over the top surface of the bladder;
contacting the top surface of the bladder with the substrate; and
applying a suctioning force to draw air from the aperture and draw the substrate downward onto the top surface of the bladder.

17. The method of claim 16, wherein the step of contacting comprises inflating the bladder.

18. The method of claim 16, further comprising the step of positioning the bladder on a support structure operable to move the bladder in a vertical direction; wherein the step of contacting comprises activating the support structure to vertically move the bladder into contact with the substrate.

19. A method of supporting a substrate for placement of a component thereon, comprising the steps of:
providing an inflatable bladder comprising an air-filled chamber and a channel extending through the chamber and opening at a top surface and at a bottom surface of the bladder;
positioning a substrate over the top surface of the bladder; and applying a suctioning force to draw air from the channel and draw the substrate downward onto the top surface of the bladder.

20. A method of supporting a substrate for placement of a component thereon, comprising the steps of:
providing an inflatable bladder comprising an air-filled chamber, a channel extending through the chamber with an opening at an upper side and at a bottom side of the bladder, and a baffle within the chamber and extending from the upper side to the bottom side of the bladder;
positioning a substrate over the top surface of the bladder; and
applying a suctioning force to draw air from the channel and draw the substrate downward onto the top surface of the bladder.

21. A method of supporting a substrate for placement of a component thereon, comprising the steps of:
providing an inflatable bladder situated within a containment structure, the bladder comprising a top surface, a bottom surface, and one or more apertures extending from the top surface to the bottom surface of the bladder;
positioning the bladder on a support structure operable to move the bladder in a vertical direction;
attaching a suctioning device to the bladder;
positioning a substrate over the top surface of the bladder; and
applying a suctioning force to draw air from the aperture and draw the substrate downward onto the top surface of the bladder.

22. A method of supporting a substrate for placement of a component thereon, comprising the steps of:
providing a bladder comprising a top surface, a bottom surface, and one or more apertures extending from the top surface to the bottom surface;
positioning the bladder within a containment structure comprising a pair of rails positioned on opposing sides of the bladder, each rail having a slot formed therein for slidably receiving the substrate therethrough such that the substrate is positioned above the bladder;
attaching a suctioning device to the bladder;
positioning the substrate in the slots of the rails and over the top surface of the bladder; and
applying a suctioning force to draw air from the aperture and draw the substrate downward onto the top surface of the bladder.

23. A method of supporting a substrate for placement of a component thereon, comprising the steps of:
providing a bladder comprising a top surface, a bottom surface, and one or more apertures extending from the top surface to the bottom surface;
positioning the bladder within a containment structure comprising a pair of rails positioned on opposing sides of the bladder, each rail having a slot formed therein for slidably receiving the substrate therethrough such that the substrate is positioned above the bladder;
attaching a suctioning device to the bladder;
positioning the substrate in the slots of the rails and over the top surface of the bladder;
inflating the bladder to bring the top surface of the bladder into contact with the substrate received within the slots of the rails; and
applying a suctioning force to draw air from the aperture and draw the substrate downward onto the top surface of the bladder.

24. A method of supporting a substrate for placement of a component thereon, comprising the steps of:
providing a bladder comprising a top surface, a bottom surface, and one or more apertures extending from the top surface to the bottom surface;
positioning the bladder within a containment structure comprising a pair of rails positioned on opposing sides of the bladder, each rail having a slot formed therein for slidably receiving the substrate therethrough such that the substrate is positioned above the bladder;
situating the bladder on a support structure operable to move the bladder in a vertical direction;
attaching a suctioning device to the bladder;
positioning the substrate in the slots of the rails and over the top surface of the bladder;
actuating the support structure to bring the top surface of the bladder into contact with the substrate received within the slots of the rails; and
applying a suctioning force to draw air from the aperture and draw the substrate downward onto the top surface of the bladder.

25. A method of supporting a substrate, comprising the steps of:
providing an inflatable bladder comprising a top surface, a bottom surface, a cavity, and one or more apertures disposed within the cavity and extending from the top surface to the bottom surface;
positioning the substrate proximate the top or bottom surface of the bladder;
introducing a fluid into the cavity to inflate the bladder; and
providing suction through the apertures to secure the substrate onto the top or bottom surface of the bladder.

26. The method of claim 25, wherein the bladder and suction inhibit the substrate from bending, bowing, or flexing.

27. The method of claim 25, further comprising the step of expelling at least a portion of the fluid from the cavity to deflate the bladder.

28. The method of claim 25, further comprising the step of placing one or more components on the substrate, and moving the substrate to a subsequent step in an assembly process.

29. The method of claim 25, further comprising the step of adjusting the suction through the apertures.

30. A method of supporting a substrate, comprising the steps of:
providing an inflatable bladder comprising a top surface, a bottom surface, a cavity, one or more apertures within the cavity and extending from the top surface to the bottom surface of the bladder, and at least one baffle within the cavity extending from the top surface to the bottom surface of the bladder;
positioning the substrate proximate the top or bottom surface of the bladder;
introducing a fluid into the cavity to inflate the bladder; and
providing suction through the apertures to secure the substrate onto the top or bottom surface of the bladder.

31. The method of claim 30, further comprising the step of adjusting the suction through the apertures.

32. The method of claim 30, further comprising the step of expelling at least a portion of the fluid from the cavity to deflate the bladder.

33. The method of claim 30, wherein the fluid comprises a gas.

34. The method of claim 30, wherein the fluid comprises a liquid.

35. A method of placing components on a substrate, comprising the steps of:

provicing an inflatable bladder comprising a top surface, a bottom surface, a cavity, and one or more apertures disposed within the cavity and extending from the top surface to the bottom surface of the bladder;

positioning the substrate proximate the top or bottom surface of the bladder;

introducing a fluid into the cavity to inflate the bladder;

applying a suctioning force to draw air through the apertures and secure the substrate onto the top or bottom surface of the bladder; and placing a component onto the substrate.

36. A method of supporting a substrate, comprising the steps of:

providing an inflatable bladder within a containment structure, the bladder comprising a top surface, a bottom surface, a cavity, and one or more apertures within the cavity extending from the top surface to the bottom surface of the bladder;

positioning the substrate proximate the top or bottom surface of the bladder;

introducing a fluid into the cavity to inflate the bladder; and applying a suctioning force to draw air through the apertures and secure the substrate onto the top or bottom surface of the bladder.

37. The method of claim 36, wherein the containment structure comprises a pair of opposing rails with the bladder situated therebetween, each of the rails having a slot extending lengthwise along the rail and oriented toward the bladder, the slot sized for slidably receiving the substrate therethrough to position the substrate over the top or bottom surface of the bladder.

38. A method of supporting a substrate, comprising the steps of:

providing an inflatable bladder comprising a top surface, a bottom surface, a chamber, and one or more apertures extending through the chamber from the top surface to the bottom surface of the bladder, and a cover over a portion of the top surface of the bladder;

positioning the substrate proximate the top surface of the bladder;

inflating the bladder; and providing a suctioning force to draw air through the apertures to secure the substrate onto the top surface of the bladder.

39. A method of supporting a substrate, comprising the steps of:

providing an inflatable bladder comprising a top surface, a bottom surface, a cavity, and one or more apertures extending through the cavity from the top surface to the bottom surface of the bladder;

positioning the bladder within a containment structure comprising a pair of opposing rails with the bladder situated therebetween, each of the rails having a slot extending lengthwise along the rail and oriented toward the bladder, the slot sized for slidably receiving the substrate therethrough to position the substrate over the top or bottom surface of the bladder;

positioning the substrate within the slots of the rails and over the top surface of the bladder;

inflating the bladder to contact the top surface of the bladder with the substrate; and providing a suctioning force to draw air through the apertures to draw the substrate onto the top surface of the bladder.

40. A method of supporting a substrate, comprising the steps of:

providing an inflatable bladder comprising a top surface, a bottom surface, a cavity, and one or more apertures extending through the cavity from the top surface to the bottom surface of the bladder;

positioning the bladder onto a support operable to move the bladder in a vertical direction;

positioning the substrate over the top surface of the bladder;

moving the support in a vertical direction to bring the top surface of the bladder into contact with the substrate; and providing a suctioning force to draw air through the apertures to draw the substrate onto the top surface of the bladder.

41. The method of claim 40, further comprising inflating the bladder.

* * * * *

UNITED STATES PATENT AND TRADEMARK OFFICE
CERTIFICATE OF CORRECTION

PATENT NO. : 6,898,838 B2
DATED : May 31, 2005
INVENTOR(S) : Brian F. Gordon

It is certified that error appears in the above-identified patent and that said Letters Patent is hereby corrected as shown below:

Column 9,
Line 64, delete "146f" and replace it with -- 14 of --.

Signed and Sealed this

Twenty-third Day of August, 2005

JON W. DUDAS
*Director of the United States Patent and Trademark Office*